United States Patent
Grothe et al.

[11] Patent Number: 6,023,128
[45] Date of Patent: Feb. 8, 2000

[54] ELECTROLUMINESCENT LAYER ARRANGEMENT WITH ORGANIC SPACERS JOINING CLUSTERS OF NANOMATERIAL

[75] Inventors: Wolfgang Grothe, Tiefenbronn; Werner Gruenwald, Gerlingen; Martin Hueppauff, Stuttgart; Claus Schmidt, Magstadt; Dieter Fenske, Ettlingen; Guenter Schmid, Velbert, all of Germany

[73] Assignee: Robert Bosch GmbH, Stuttgart, Germany

[21] Appl. No.: 08/952,941

[22] PCT Filed: Feb. 24, 1996

[86] PCT No.: PCT/DE96/00309

§ 371 Date: May 6, 1998

§ 102(e) Date: May 6, 1998

[87] PCT Pub. No.: WO96/38023

PCT Pub. Date: Nov. 28, 1996

[30] Foreign Application Priority Data

May 22, 1995 [DE] Germany .......................... 195 18 668

[51] Int. Cl.$^7$ .......................................... H01J 1/62
[52] U.S. Cl. .............................. 313/506; 445/24; 445/58; 313/498; 313/499
[58] Field of Search .................................. 313/506, 498, 313/499; 445/24, 58

[56] References Cited

U.S. PATENT DOCUMENTS

5,537,000  7/1996  Alivisatos et al. .

FOREIGN PATENT DOCUMENTS

0 281 381  9/1988  European Pat. Off. .

*Primary Examiner*—Michael B Shingleton
*Attorney, Agent, or Firm*—Kenyon & Kenyon

[57] ABSTRACT

An electroluminescent layer arrangement having a light-emitting organic material arranged between two electrodes which can be connected to a DC voltage source, a first electrode being a hole-injecting electrode (anode) and a second electrode being an electron-injecting electrode (cathode). The hole-injecting electrode and/or the electron-injecting electrode consist, at least locally, of a nanomaterial.

6 Claims, 1 Drawing Sheet

ELECTROLUMINESCENT LAYER ARRANGEMENT WITH ORGANIC SPACERS JOINING CLUSTERS OF NANOMATERIAL

FIELD OF THE INVENTION

The present invention related to an electroluminescent layer arrangement.

BACKGROUND INFORMATION

Conventional electroluminescent layer arrangements consist of either inorganic or organic substances, which can be excited by means of an electrical voltage to emit light. The light-emitting substances are arranged between flat electrodes, a first electrode being configured as a hole-injecting electrode and a second electrode as an electron-injecting electrode. If the light-emitting substance is composed of an organic material, excitation can be accomplished by means of a DC voltage source. In this conventional arrangement the hole-injecting electrode is connected to the positive terminal of the DC voltage source, and the electron-injecting electrode to the negative terminal of the DC voltage source. A conventional electroluminescent layer arrangement of this type is described in European Patent Application No. EP 0 281 381, in which the hole-injecting electrode consists of a metal or an electrically conductive optically transparent oxide compound with a high electron emission energy (greater than 4.5 eV). The electron-injecting electrode consists of a metal other than an alkali metal, and possesses a low electron emission energy. A disadvantage of this conventional arrangement is that there is a very limited number of possible combinations due to the requirement that the selection of the electrode materials must be mutually matched, i.e. one hole-injecting electrode and one electron-injecting electrode.

SUMMARY OF THE INVENTION

The electroluminescent layer arrangement according to the present invention offers the advantage that the properties of the hole-injecting and/or electron-injecting electrodes can easily be adapted to the specific requirements of the electroluminescent layer arrangement. Since the hole-injecting electrode and/or the electron-injecting electrode in the present invention are made of a nanomaterial i.e., (a material with an average particle size in the nanometer range), it is possible to establish an electron emission energy as low or high as desired by varying the properties and dimensioning of the nanomaterial. Thus, the nanomaterials can easily be adapted to the requirements of a hole-injecting or electron-injecting electrode.

A preferred embodiment of the present invention provides for the nanomaterials to be composed of clusters, embedded in a matrix, which preferably are surrounded by organic ligand shells. The advantage in such an arrangement is that it stabilizes the clusters by way of the ligand shells and thus makes the hole-injecting electrode and/or the electron-injection electrode corrosion-resistant. The electron emission energy of the particular electrode can be adjusted via the dimensioning of the clusters.

DETAILED DESCRIPTION

Figure 1:
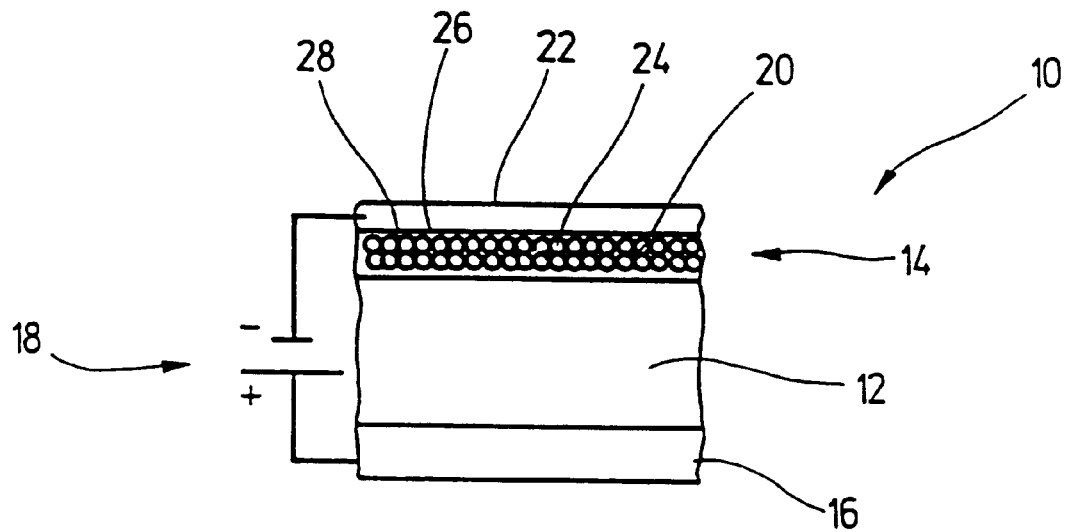
FIG. 1 shows a cross-sectional view of an electroluminescent layer arrangement according to the present invention.

FIG. 1 shows a cross-section of an electroluminescent layer arrangement 10 according to the present invention, possessing a light emitting material 12 that is arranged between a first electrode 14 and a second electrode 16. Electrodes 14 and 16 are flat in configuration, so that light-emitting material 12 located between electrodes 14 and 16 is also planar in configuration. Electrodes 14 and 16 are connected to a voltage source 18, for example to a DC'voltage source, in particular to a battery of a motor vehicle. In this context, electrode 14 is connected to the negative terminal of voltage source 18 or to ground, and electrode 16 to the positive terminal of voltage source 18.

Light-emitting material 12 possesses at least one organic substance that is capable, upon application of a voltage, of emitting light. The color of the light emitted is determined, by the chemical structure of the organic substance used. Some light-emitting organic substances that may, be considered are, for example polymers, low-molecular-weight organic compounds, monomers, or molecularly doped polymers.

Further layers (not depicted here), which also serve to emit light or to transport charge carriers to light-emitting material 12, can be arranged between electrodes 14 and 16.

Electrode 16 consists of a hole-injecting material, such as indium-tin oxide, for example. Indium-tin oxide electrodes are can be used because they have a high electron emission energy. Additionally, electrode 16 is optically transparent, so that light emitted by means of organic material 12 can be radiated from the layer arrangement 10.

Electrode 14 possesses an electron-injecting layer 20 and a contact 22 applied onto layer 20. Contact 22 can, for example, be created from aluminum that has been vacuum-evaporated onto layer 20. Electron-injecting layer 20 consists of individual clusters 24 which are embedded in a matrix 26 and can be joined to one another via organic ligand shells 28. Transition metal chalcogenide clusters can, for example, be used as clusters 24. Clusters 24 are, selected and arranged so that they have specific electronic and mechanical properties. In the embodiment shown in FIG. 1, clusters 24 are selected and arranged so that they have a low electron emission energy or low electron affinity. Organic ligand shells 28 stabilize clusters 24 in matrix 26. The organic ligand shell determine the positioning of clusters 24 inside the electron-injecting layer by chemically bonding with one another which determines the mechanical stability of layer 20 and thus the position of clusters 24. The separation between each cluster in clusters 24 from one another can be established by selecting a thickness for the ligand shell. The thickness of ligand shell 28 is selected so as to allow electron conduction through layer 20, such that the electrons tunnel through the ligand shells. The ligand shells made of organic substances possess a high mobility for holes, so that the electrons can move within the ligand shell. The tunneling capability resulting therefrom guarantees the electron-injecting effect of electrode 14. Clusters 24 are on the nanometer scale, while ligand shells 28 are generally a few atomic layers thick. Due to the small particle size of clusters 24 (i.e., nanometer range), electron-injecting layer 20 possesses a high packing density, so that a plurality of chemical bonds form between ligand shells 28. This results in high mechanical stability for layer 20.

Figure 2:
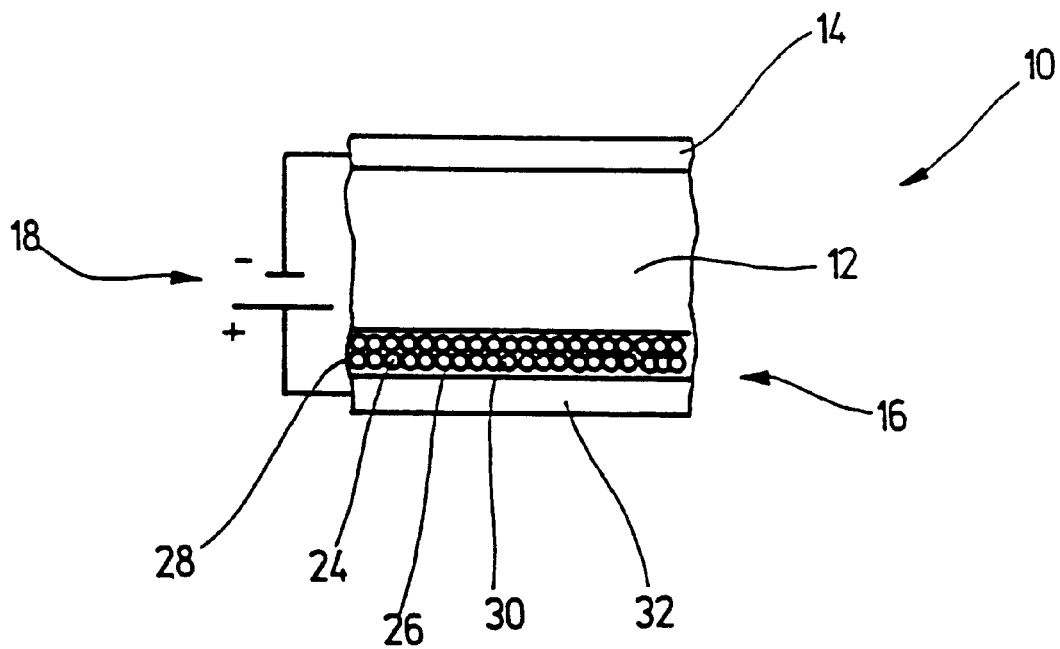
FIG. 2 shows a cross-sectional view of another electroluminescent layer arrangement according to the present invention.

FIG. 2 shows a further exemplary embodiment of the presents invention; parts identical to those in FIG. 1 are given the same reference numbers, and will not be explained again. In contrast to the embodiment shown in FIG. 1, the electrode 16 in this embodiment possesses a hole-injecting layer 30 that is equipped with a contact 32. Contact 32 can consist, for example, of indium-tin oxide. Layer 30 consists of clusters 24 that are arranged in a matrix 26 and are stabilized by means of organic ligand shells 28. The structure and function of layer 30 correspond to those presented by way of example for in the embodiment shown in FIG. 1. In this case, however, clusters 24 and/or ligand shells 28 are selected and arranged so that instead of forming an electron layer (20 in FIG. 1), a hole-injecting layer 30 is formed, i.e. layer 30 has a high electron emission energy or electron affinity.

According to a further exemplary embodiment of the present invention (not depicted), an electroluminescent layer system 10 can have both an electron-injecting electrode 14 having a layer 20, and a hole-injecting electrode 16 having a layer 30. Both electrodes 14 and 16, and layers 20 and 30 respectively, here possess clusters stabilized by means of organic ligand shells. The clusters can be made of a single material, and consist of different selection and arrangements and thus different electronic properties. Because of the many possibilities for varying the electronic properties of nanomaterials by way of their microscopic dimension and composition, the electron emission energy of electrodes 14 and 16 can be optimally adapted to the energy level of light-emitting material 12, in particular to its conduction band or valence band. The height of the barrier between electrode 14 or electrode 16 and light-emitting material 12 for electrons or holes can thus be minimized or eliminated. It is therefore ultimately possible, to select clusters 24 and organic ligand shells 28, to easily define both hole-injecting electrode 16 and electron-injecting electrode 14, in particular their electron emission energy.

Examples of material that can be used as nanomaterials, and after "24" insert i.e. as clusters 24, are, for example, ligand-stabilized gold, platinum, palladium, gold/platinum, and gold/palladium clusters, and chalcogenide clusters (the transition metals titanium, vanadium, manganese, iron, cobalt, nickel, copper, zinc, zirconium, niobium, rhodium, palladium, silver, cadmium, tantalum, iridium, platinum, mercury, combined with the main group elements phosphorus, arsenic, antimony, sulfur, selenium, tellurium).

What is claimed is:

1. An electroluminescent layer arrangement comprising:
   a first electrode, the first electrode being a hole-injecting electrode;
   a second electrode, the second electrode being an electron-injecting electrode;
   a light-emitting organic material arranged between the first and second electrodes, wherein the first and second electrodes are coupled to a DC voltage source, wherein at least one of the first and second electrodes is composed, at least locally, of a nanomaterial, and wherein the nanomaterial is composed of a plurality of clusters embedded in a matrix; and
   a plurality of organic spacers joining each one of the plurality of clusters to at least one other of the plurality of clusters.

2. The arrangement according to claim 1, wherein the organic spacers are composed of organic ligand shells.

3. The arrangement according to claim 1, wherein an electron emission energy of the first and second electrodes is adjusted by arranging the plurality of clusters in the matrix.

4. The arrangement according to claim 1, wherein an electron emission energy of the first and second electrodes is adjusted by varying a chemical composition of the plurality of clusters.

5. The arrangement according to claim 1, wherein the first electrode includes a hole-injecting layer having a plurality of clusters, and a contact part.

6. The arrangement according to claim 1, wherein the second electrode includes an electron-injecting layer having a plurality of clusters, and a contact part.

\* \* \* \* \*